United States Patent [19]

Asano

[11] 4,246,498
[45] Jan. 20, 1981

[54] SEMICONDUCTOR INTEGRATED DRIVING CIRCUIT INCLUDING C-MOS AND JUNCTION FET'S

[75] Inventor: Kazuhiro Asano, Tokyo, Japan

[73] Assignee: Kabushiki Kaisha Daini Sekiosha, Tokyo, Japan

[21] Appl. No.: 903,017

[22] Filed: May 4, 1978

[30] Foreign Application Priority Data

May 4, 1977 [JP] Japan .................................. 52/51463

[51] Int. Cl.³ ..................... H03K 3/353; H03K 7/687; G04C 9/08
[52] U.S. Cl. .................................. 307/270; 307/251; 307/304; 368/87; 368/219
[58] Field of Search ......... 307/270, 251, 304, DIG. 1; 58/23 A, 23 D

[56] References Cited

U.S. PATENT DOCUMENTS

| | | | |
|---|---|---|---|
| 3,591,855 | 7/1971 | Dean | 307/DIG. 1 X |
| 3,742,698 | 7/1973 | Naito | 58/23 A |
| 3,937,003 | 2/1976 | Busch et al. | 58/23 D |
| 4,028,556 | 6/1977 | Cachier et al. | 307/304 X |
| 4,032,864 | 6/1977 | Yamashiro et al. | 58/23 A X |
| 4,086,500 | 4/1978 | Suzuki et al. | 307/270 |
| 4,093,925 | 6/1978 | Yokoyama | 307/270 X |
| 4,112,671 | 9/1978 | Kato | 58/23 D |
| 4,142,111 | 2/1979 | McElroy | 307/304 X |

OTHER PUBLICATIONS

*Amelco Semiconductor-Theory and Application Notes*, No. 2, (pub.) 6/1962, pp. 1–7, "FET Characteristics and Circuit Design".
Ott, "Biasing The Junction FET", *EEE* (pub.), 1/1970, pp. 52–57.

*Primary Examiner*—Larry N. Anagnos
*Attorney, Agent, or Firm*—Robert E. Burns; Emmanuel J. Lobato; Bruce L. Adams

[57] ABSTRACT

A semiconductor integrated driving circuit including a junction FET and a C-MOS FET fabricated on a common semiconductor substrate. The junction FET is switched between conductive and non-conductive states for controlling and supplying a high driving current to a high current load element.

6 Claims, 4 Drawing Figures

FIG. 1
FIG. 3
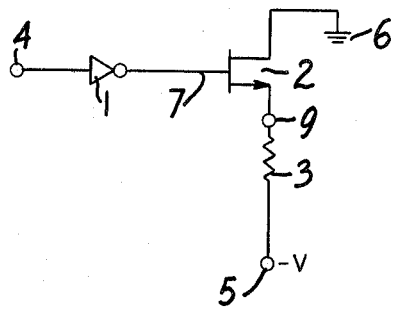
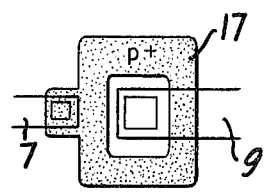
FIG. 2
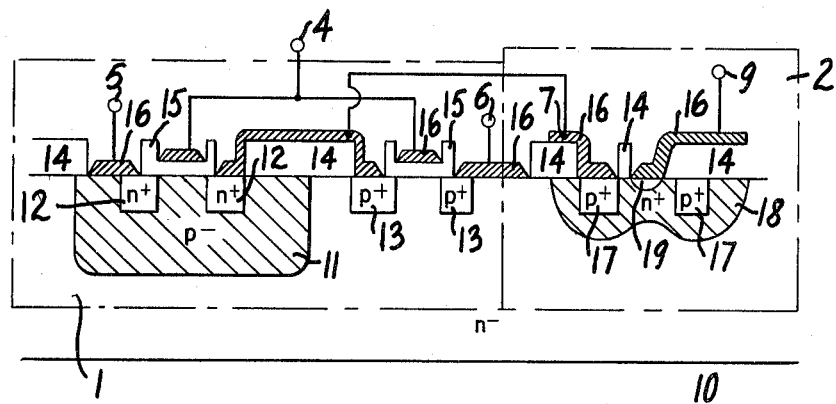
FIG. 4
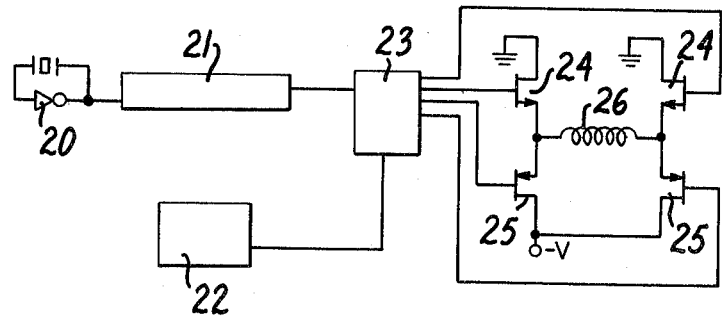

SEMICONDUCTOR INTEGRATED DRIVING CIRCUIT INCLUDING C-MOS AND JUNCTION FET'S

BACKGROUND OF THE INVENTION

The present invention relates to a high electric current driving circuit applied to an electronic timepiece or the like.

Conventionally, a bipolar transistor, a large scale MIS FET or the like are used to drive a high electric current load such as a step motor, LED, a lamp or the like in an electronic timepiece.

However, both the bipolar transistor and MIS FET have hampered the miniaturization and reduction in price of the electronic timepiece since the bipolar transistor can not be formed on the same substrate as C-MOS IC of the timepiece. Consequently, the bipolar transistor requires another chip, while MIS FET occupies the major portion of the timepiece integrated circuit.

SUMMARY OF THE INVENTION

Accordingly, it is an object of the present invention to overcome the insufficiencies and disadvantages of the conventional electric current driving circuit by providing a high current driving circuit on a small part of the same substrate as a C-MOS IC.

It is another object of the present invention to provide an electronic timpiece IC at a low price.

BRIEF ILLUSTRATION OF THE DRAWING

FIG. 1 is an equivalent circuit of the driving circuit according to the present invention, FIG. 2 is a diagram of the integrated circuit structure of the circuit illustrated in FIG. 1, FIG. 3 is a partial plan view of FIG. 2, FIG. 4 is an embodiment of an electronic timepiece incorporating the driving circuit according to the present invention.

DESCRIPTION OF THE PREFERRED EMBODIMENT

Referring first to FIG. 1 showing an equivalent circuit diagram of the driving circuit according to the present invention, reference numeral 1 is an inverter a gate input of which is connected to an input terminal 4 and an output of which is connected to a gate of a junction FET 2. A source electrode of the junction type FET 2 is connected to a high electric potential point 6 of the power source and an end of a drain electrode 9 is connected to the other electrode of a resistance (load) 3 connected to a low electric potential point 5 of the power source.

Referring then to the operation of the circuit having the above described structure, when the input terminal 4 is "H", the output from the inverter 1 is "L" and the voltage equivalent to the source voltage is applied across the gate and the source of the junction FET 2 and the FET 2 is off due to the depletion layer formed in the FET channel.

On the other hand, when the input terminal 4 is "L", the voltage applied across the gate and the source of the FET 2 becomes 0 (V) and the width of the depletion layer provided in the channel becomes extremely small and the FET is in an "ON" state and an electric current flows through the load resistance 3.

Referring then to FIG. 2 which shows the method to provide the junction FET on the same substrate as the MOS-IC.

Reference numeral 10 is a N$^-$ type substrate in which there are diffused a P$^-$ well 11, source 12 and drain 13 of P MOS FET, P$^+$ regions 17 which compose a gate of the junction FET 2, and furthermore, N$^+$ region 12 to compose an N MOS FET in the P$^-$ well 11 is diffused. While, a N$^+$ region 19 is diffused to contact with a metal wiring preferably.

On the upper surface of the N$^+$ region, there are provided a field oxidation insulating film 14 and a gate oxidation insulating film 15, which are mutually wired by a metal 16 contact such as aluminum or the like and compose the inverter 1 and the junction FET 2.

The illustration of the inverter 1 is eliminated since it is already known.

The junction FET 2 is composed of the P$^+$ region 17 as a gate, the substrate 10 as a source and the electrode 9 as a drain.

FIG. 3 shows a plan view of the junction FET, wherein the gate P$^+$ 17 is formed in "☐" shape and the surrounded portion of N$^+$ material is a drain region.

In the composition described so far, when the N$^+$ substrate 10 is connected to the high electric potential point 6 of the power source and the gate P$^+$ 17 is connected to the low electric potential point 5 of the power source, a reverse bias is applied to the P-N junction of the substrate 10 and the gate P$^+$ 17, and then the depletion layer 18 is formed.

The width Xd of the depletion layer 18 is given by way of equation (1).

$$Xd = \left( \frac{2 \times \epsilon \times \phi B}{q \times ND} \right) \tag{1}$$

The symbol $\epsilon si$ is a dielectric constant of silicon, $\phi B$ is a voltage applied to the P-N junction, ND is a impurity concentration of the N$^-$ substrate and q is an electric charge of the electron.

For instance, is an electronic timepiece having an LED display is composed of an N$^-$ substrate of ND=$5 \times 10^{14}$[1/cm$^3$], when the supply voltage is 3 V, the formula gives the following result:

$$Xd = \frac{2 \times 11.7 \times 8.85 \times 10^{-14} \times (3.0 + 0.7)^{\frac{1}{2}}}{5 \times 10^{14} \times 1.6 \times 10^{-19}} = 3.1 \ (\mu m)$$

Accordingly, if the width of the short side of a rectangle in the gate P$^+$ region 17 is 6 $\mu$m in width, the depletion layer 18 perfectly fills up the space between the source 10 to the drain 9. In this condition, source-to-drain current is cut off and the electric current through the FET 2 stops flowing.

When the gate-to-source voltage is "0", the width of the depletion layer is reduced to 1.3 $\mu$m and an interstice breaks through the depletion layer between the source to the drain and the channel is formed and the electric current flows through the FET 2.

Since the output impedance of the above mentioned channel is equal to the resistance of the substrate 10 and the saturation of because electric current doesn't occur, a high electric current load can be driven by a small FET in comparison with the MOS FET which uses only the neighboring portion of the surface of the semiconductor substrate 10 for conduction.

As illustrated so far, according to the present invention, since the high current load can be easily driven by the application of the junction FET having a small area, the chip size of the electronic timepiece or the like required to drive the high electric current load, such as an LED display electronic timepiece can be extensively reduced. Thus, the present invention is influential upon reduction in price and miniaturization of the timepiece.

On the other hand, according to the present invention, though the bias voltage applied to the gate of the junction FET and the source voltage are the same, a boosted voltage can be applied to the bias voltage as well in order to increase the difference of the width of the depletion layer in case of zero bias and reverse bias.

The present invention is efficient for the case of the system which operates at a voltage under 1.5 V, and the embodiment of which is shown in FIG. 4.

FIG. 4 illustrates an electronic timepiece circuit incorporating the driving circuit according to the present invention. An oscillator circuit 20 generates an oscillating output signal which is divided by the divider circuit 21 for generating a lower frequency output signal. Elements 24 and 25 define two pair of complementary junction field effect transistors which are integrated and which are connected in a bridge circuit for controlling energization of the timepiece motor coil 26. Control circuit 23 includes C-MOS elements fabricated on the same substrate as the pairs of complementary junction field effect transistors, in the manner shown in FIG. 2. An optional voltage booster circuit 22 can be used to bias the junction field effect transistors 24, 25 as discussed above.

According to the present invention, though the junction FET is provided in the substrate, the junction FET can also be provided in the well. In this case the FET gate becomes n+.

I claim:

1. A driving circuit for an electronic timepiece, comprising: a high current load element; a semiconductor integrated circuit including a junction FET and a plurality of C-MOS elements fabricated on a common semiconductor substrate; means comprised of at least one of said C-MOS elements for controlling the conductivity of said junction FET; and means electrically connecting said junction FET to said high current load element for supplying a high driving current flowing through said junction FET to said high current load element according to the conductivity of said junction FET.

2. A driving circuit for an electronic timepiece as claimed in claim 1, wherein said high current load element is a timepiece motor driving coil.

3. A driving circuit for an electronic timepiece as claimed in claim 2, wherein said junction FET has a conductive state when the junction FET source-to-drain voltage is zero, and a non-conductive state when the source-to-drain voltage is non-zero.

4. A driving circuit for an electronic timepiece as claimed in claim 2, further comprising means for applying a bias voltage higher than the junction FET source voltage to said junction FET for switching said junction FET from the conductive to the non-conductive state.

5. A driving circuit for an electronic timepiece as claimed in claim 1, wherein said means for controlling the conductivity of said junction FET is comprised of a C-MOS inverter having an output connected to a gate of said junction FET, wherein said C-MOS inverter is fabricated on said semiconductor substrate.

6. In an electronic timepiece comprising a timepiece motor coil, and a timepiece circuit including an oscillator circuit for generating an oscillatory output signal, a divider circuit for dividing the output signal from said oscillator circuit and for generating a lower frequency output signal, a driving circuit for driving the timepiece motor coil and a control circuit responsive to the lower frequency output signal from the divider circuit for controlling said driving circuit, the improvement comprising: said driving circuit comprising two pair of integrated complementary junction field effect transistors integrated on a substrate and connected in a bridge circuit and connected to said timepiece motor coil for energizing said timepiece motor coil by high current driving signals applied to said timepiece motor coil through said junction field effect transistors; and said control circuit comprising C-MOS elements fabricated on said substrate with said complementary junction field effect transistors of said driving circuit for controlling the conductivity of said junction field effect transistors to control energization of said timepiece motor coil.

* * * * *